United States Patent
Kuo et al.

(10) Patent No.: US 12,072,750 B2
(45) Date of Patent: *Aug. 27, 2024

(54) POWER MANAGEMENT CIRCUIT, SYSTEM-ON-CHIP DEVICE, AND METHOD OF POWER MANAGEMENT

(71) Applicant: Taiwan Semiconductor Manufacturing Company, Ltd., Hsinchu (TW)

(72) Inventors: Chia-Chen Kuo, Hsinchu (TW); Yangsyu Lin, New Taipei (TW); Yu-Hao Hsu, Tainan (TW); Cheng Hung Lee, Hukou Township (TW); Hung-Jen Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/337,449

(22) Filed: Jun. 20, 2023

(65) Prior Publication Data

US 2023/0350477 A1 Nov. 2, 2023

Related U.S. Application Data

(63) Continuation of application No. 17/410,938, filed on Aug. 24, 2021, now Pat. No. 11,726,539.

(60) Provisional application No. 63/154,524, filed on Feb. 26, 2021.

(51) Int. Cl.
*G06F 1/32* (2019.01)
*G06F 1/3206* (2019.01)
*G06F 1/3234* (2019.01)

(52) U.S. Cl.
CPC .......... *G06F 1/3206* (2013.01); *G06F 1/3275* (2013.01)

(58) Field of Classification Search
CPC ............................ G06F 1/3206; G06F 1/3275
See application file for complete search history.

(56) References Cited

U.S. PATENT DOCUMENTS

| | | |
|---|---|---|
| 2006/0017467 A1 | 1/2006 | Lai |
| 2007/0030057 A1 | 2/2007 | Wang et al. |
| 2016/0066280 A1 | 3/2016 | Heo et al. |
| 2016/0275999 A1 | 9/2016 | Chhabra |
| 2021/0004030 A1 | 1/2021 | Chang et al. |

FOREIGN PATENT DOCUMENTS

| | | |
|---|---|---|
| CN | 109976496 A | 7/2019 |
| KR | 2018-0069666 A | 6/2018 |
| TW | 201101688 A | 1/2011 |
| TW | 201724105 A | 7/2017 |
| TW | 201824284 A | 7/2018 |
| TW | 201911695 A | 3/2019 |
| TW | 202103447 A | 1/2021 |

*Primary Examiner* — Stefan Stoynov
(74) *Attorney, Agent, or Firm* — Finnegan, Henderson, Farabow, Garrett & Dunner, L.L.P.

(57) ABSTRACT

A circuit includes a power detector and a logic circuit. The power detector is configured to output a first power management signal according to a first power supply signal from a first power supply and a status signal. The circuit is configured to operate in different modes in response to the status signal. The logic circuit is configured to output a second power management signal, according to the first power management signal and the status signal.

20 Claims, 13 Drawing Sheets

POWER MANAGEMENT CIRCUIT, SYSTEM-ON-CHIP DEVICE, AND METHOD OF POWER MANAGEMENT

REFERENCE TO RELATED APPLICATION

This application is a continuation application of U.S. Non-provisional patent application Ser. No. 17/410,938, filed on Aug. 24, 2021 (now allowed), which claims the benefit of U.S. Provisional Application No. 63/154,524, filed on Feb. 26, 2021, all of which are incorporated herein by reference in their entireties.

BACKGROUND

Dual rail devices, such as dual rail static random access memory (SRAM), have different logic circuits operating at different power supply voltages. For example, a part of the SRAM, called a memory periphery logic circuit, can operate at a lower power supply voltage than the bits of the memory array, another part of the SRAM, which operate at a higher supply voltage, to reduce dynamic power consumption. This technique allows for a reduction of the active power required while maintaining sufficient performance. However, dual rail designs suffer significant cross domain leakage when the two power supplies are turned on or off.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
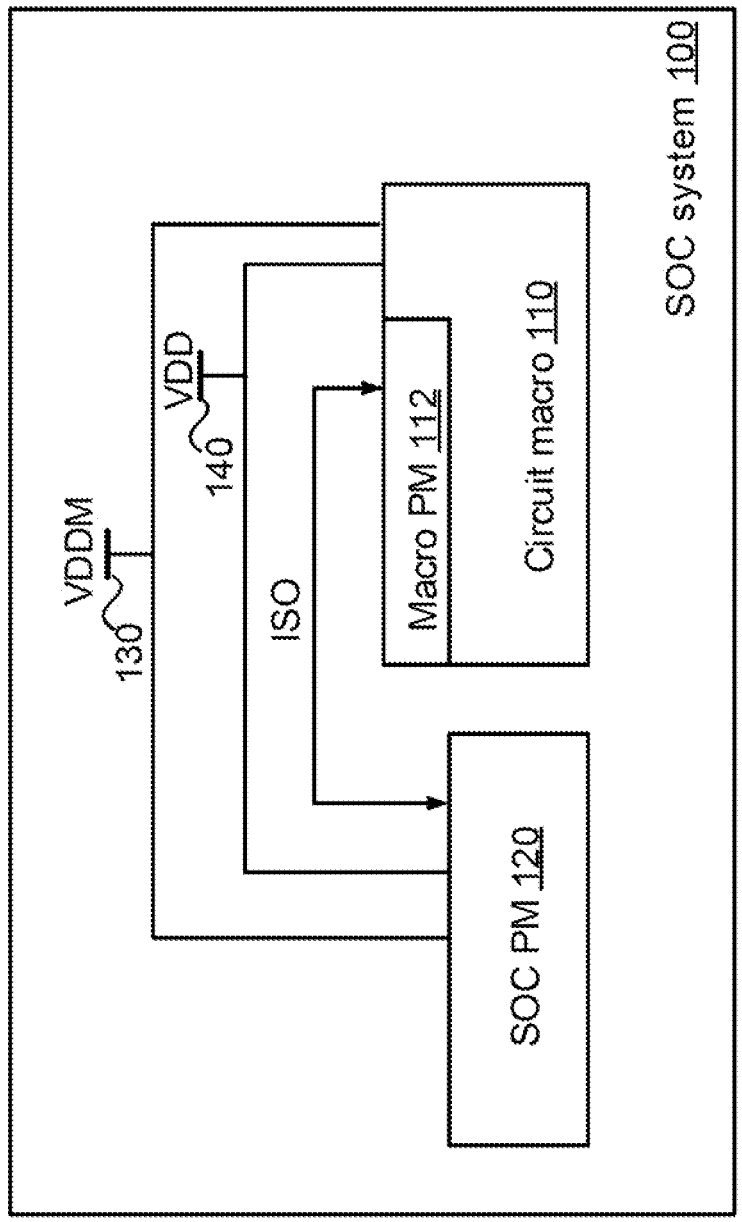
FIG. 1 is a block diagram illustrating a system-on-chip (SOC) system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected." "Coupled" and "connected" may also be used to indicate that two or more elements cooperate or interact with each other.

Embodiments of the present disclosure are described herein in the context of exemplary dual rail devices. It is to be appreciated that the present disclosure is not limited to specific circuits and systems illustratively shown and described herein. In this manner, embodiments of the present disclosure provide a power management circuit that can be beneficially used in a variety of memory arrangements and types, such as, for example, random access memory (RAM), static random-access memory (SRAM), read-only memory (ROM), content addressable memory (CAM), flash memory, register files, and the like. Moreover, it will be apparent to those skilled in the art given the teachings herein that modifications can be made to the embodiments shown that are within the scope of the present disclosure.

In some embodiments, dual rail devices can be embedded SRAM devices, which are popular in high-speed communication, image processing and system on chip (SOC) applications. FIG. 1 is a block diagram illustrating a system-on-chip (SOC) system 100 according to some embodiments of the present disclosure. In some embodiments, the SOC system 100 may be situated in a computer or other electronic systems. As shown in FIG. 1, the SOC system 100 includes a circuit macro 110 having a circuit macro power management ("PM") circuit 112, and a SOC power management circuit 120 coupled to the circuit macro 110. In some embodiments, the circuit macro 110 may be a SRAM having a plurality of memory arrays, typically two dimensional, of memory bit cells configured to store respective logic states, i.e., either a logical high (logical "1") or a logical low (logical "0"). The memory bit cells are often arranged in one or more parallel columns.

The SOC power management circuit 120 is configured to control the power behavior, e.g., power-on, power-off, power state selection, etc., of the circuit macro 110 via one or more power management control signals. For example, the SOC power management circuit 120 can transmit one or more power management signals to the circuit macro power management circuit 112 in the circuit macro 110, so that the circuit macro power management circuit 112 can accordingly control circuits in the circuit macro 110 to achieve proper power management.

The circuit macro 110 on the chip may operate with two independently controlled power sources 130 and 140. For example, the circuit macro 110 may include a first circuit that operates in a first power domain (e.g., a VDDM power domain) and a second circuit that operates in a second power domain (e.g., a VDD power domain). In some embodiments, the first circuit is referred to as a VDDM domain circuit, and the second circuit is referred to as a VDD domain circuit.

In some embodiments, the VDDM domain circuit can be an array of SRAM cells operating at a power supply voltage VDDM, and the VDD domain circuit can be, for example, a memory periphery logic circuit that operates at a power supply voltage VDD that is lower than the power supply voltage VDDM. The VDD domain circuit and the VDDM domain circuit are interfaced to one another. In some embodiments, the VDDM domain circuit is connected to the VDDM supply through a respective switch controlled by a control signal. The VDD domain circuit is connected to the VDD supply through another respective switch controlled by another control signal. For example, header switches can be P-channel metal-oxide-semiconductor (PMOS) transistor switches. When the header control signals are logical low, the VDDM domain circuit and VDD domain circuit are respectively coupled to power supplies VDDM and VDD. In some other embodiments, different types of switches, such as N-channel metal-oxide-semiconductor (NMOS) transistor switches, can be used. Accordingly, when the header control signals are logical high, the VDDM domain circuit and VDD domain circuit are respectively coupled to power supplies VDDM and VDD.

In some embodiments, the circuit macro 110 is structured so that the memory arrays and the word line driver circuits substantially operate at the voltage VDDM, while the data paths and the control circuit are configured to operate at both the voltage VDDM and the voltage VDD. Specifically, a portion of the data paths and a portion of the control circuit are configured to operate at the voltage VDDM, while a remaining portion of the data paths and a remaining portion of the control circuit are configured to operate at the lower voltage VDD. Therefore, the data paths and the control circuit are cross-domain circuits, and an undesired interface leakage current occurs in the circuit macro 110 due to the DC leakage path during a power-on period or during a sleep mode. In the power-on period, two power sources (e.g., the voltage VDDM and the voltage VDD) ramp up at different speeds. In the sleep mode operation, one of the power sources (e.g., the voltage VDDM) is floating and causes the interface leakage current. To reduce the interface leakage current in the cross-domain circuit in the circuit macro 110, the SOC power management circuit 120 needs to output one or more power management signals, such as an isolation signal ISO to isolate the interface circuitry between the VDDM power domain and the VDD power domain.

Figure 2:
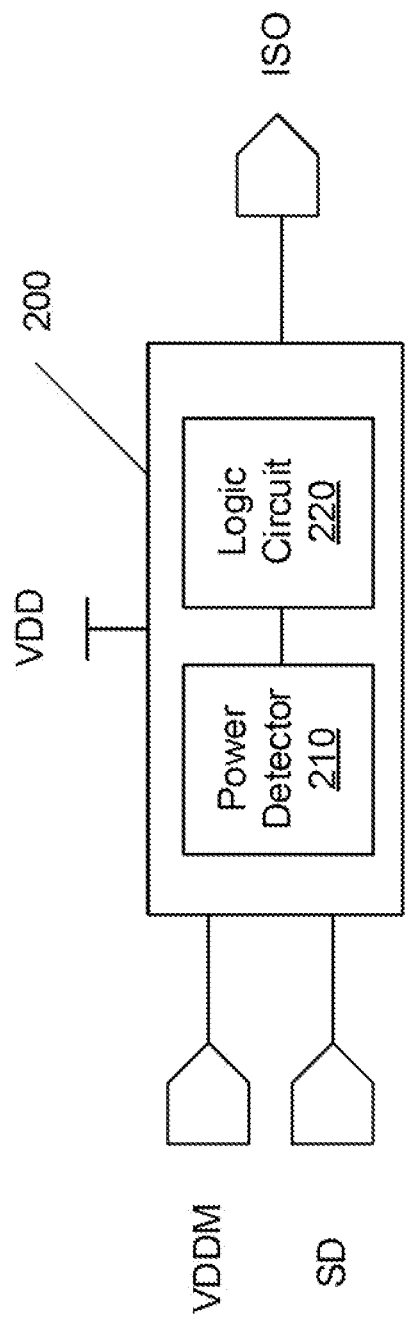
FIG. 2 is a diagram illustrating the generation of the isolation signal, according to some embodiments of the present disclosure.

FIG. 2 is a diagram illustrating the generation of the isolation signal ISO, according to some embodiments of the present disclosure. In FIG. 2, a power management circuit 200 is part of the SOC power management circuit 120 of FIG. 1 and is configured to generate the isolation signal ISO required in the power management for the SOC system 100. As shown in FIG. 2, the power management circuit 200 is configured to generate and output the isolation signal ISO according to a first power supply signal (e.g., power voltage VDDM) of a first power supply and a status signal (e.g., status signal SD). In some embodiments, when the power management circuit 200 outputs the isolation signal ISO with a logical high value, the isolation of the interface circuitry can be enabled to reduce the leakage current due to the DC leakage path of the cross-domain circuit in the circuit macro 110 shown in FIG. 1. In some embodiments, the power management circuit 200 includes a power detector 210 and a logic circuit 220 electrically connected to the power detector 210, which will be discussed in more detail below.

Figure 3:
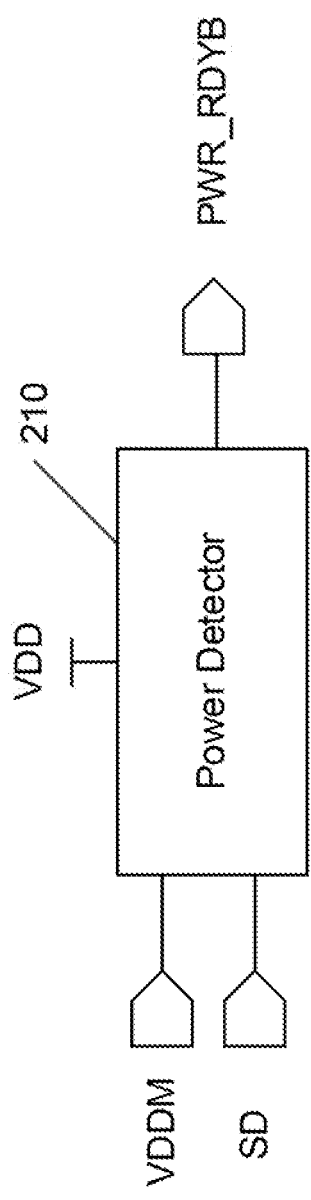
FIG. 3 is a diagram illustrating a power detector, according to some embodiments of the present disclosure.

FIG. 3 is a diagram illustrating generating a power management signal PWR_RDYB by the power detector 210 of FIG. 2, according to some embodiments of the present disclosure. As shown in FIG. 3, the power detector 210 is configured to generate and output the power management signal PWR_RDYB according to the first power supply signal (e.g., power voltage VDDM) of the first power supply and the status signal (e.g., status signal SD). The power management signal PWR_RDYB can be used to confirm whether the power voltages and the status signal SD are at their respective proper levels. In some embodiments, the power management signal PWR_RDYB is a power ready bar signal, which is an inverted signal of a power ready signal indicating that the power voltages VDD, VDDM, and the status signal SD are ready for performing the circuit operation in the circuit macro 110, such as memory access operations. Alternatively stated, when the power management signal PWR_RDYB is a logical high, the power voltages and the status signal SD are not ready for performing the circuit operation in the circuit macro 110, such as memory access operations. When power management signal PWR_RDYB is a logical low, the power voltages and the status signal SD are ready for performing the circuit operation in the circuit macro 110.

Figure 4:
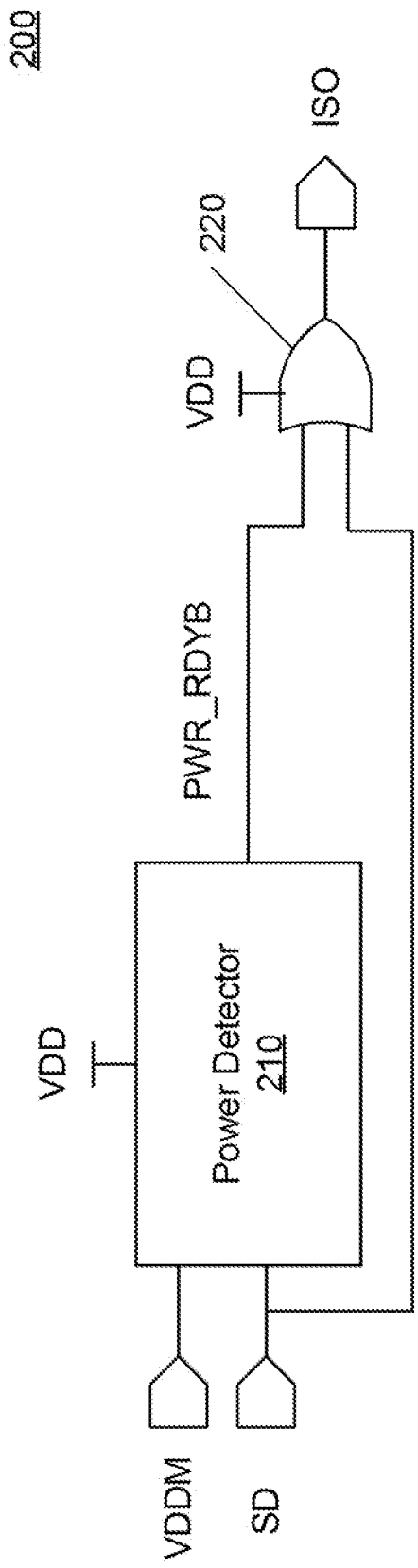
FIG. 4 is a diagram illustrating a first design of the power management circuit, according to some embodiments of the present disclosure.

FIG. 4 is a diagram illustrating a first design of the power management circuit 200 of FIG. 2, according to some embodiments of the present disclosure. As shown in FIG. 4, the power management circuit 200 includes the power detector 210 shown in FIG. 3 and a logic circuit 220. The logic circuit 220 is coupled to an output of the power detector 210 and configured to receive the power management signal PWR_RDYB, and output the isolation signal ISO, which is the second power management signal, according to the received power management signal PWR_RDYB and the status signal SD. As explained above, when the isolation signal ISO with a logical high value is outputted from the power management circuit 200 to the circuit macro 110, the isolation of the interface circuitry can be enabled to reduce the leakage current due to the DC leakage path of the cross-domain circuit in the circuit macro 110.

In embodiments of FIG. 4, the logic circuit 220 includes an OR gate logic circuit. A first input terminal of the logic circuit 220 is coupled to the power detector 210 and configured to receive the power management signal PWR_RDYB. A second input terminal of the logic circuit 220 is coupled to a corresponding pin and configured to receive the status signal SD. An output terminal of the logic circuit 220 is configured to output the isolation signal ISO.

Accordingly, the power management circuit 200 is configured to output the isolation signal ISO with the logical high value to activate the isolation of the interface circuitry in response to either the status signal SD being logical high, or the power management signal PWR_RDYB being logical high.

Figure 5:
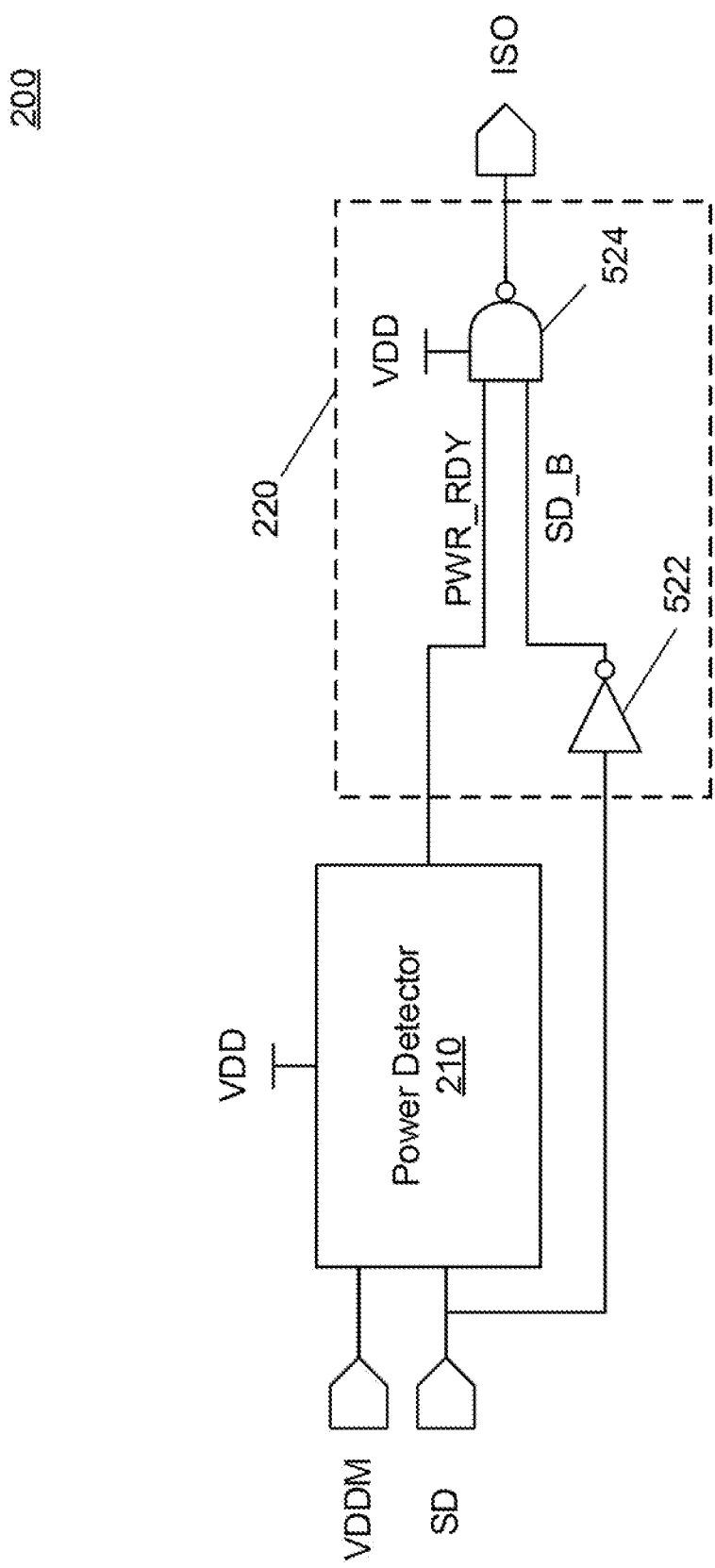
FIG. 5 is a diagram illustrating a second design of the power management circuit, according to some embodiments of the present disclosure.

FIG. 5 is a diagram illustrating a second design of the power management circuit 200 of FIG. 2, according to some embodiments of the present disclosure. Compared to the embodiments of FIG. 4, the logic circuit 220 in FIG. 5 is coupled to an output of the power detector 210 and configured to output the isolation signal ISO, according to a power management signal PWR_RDY and the status signal SD. Similar to the embodiments of FIG. 4, when the power management circuit 200 outputs the isolation signal ISO with a logical high value to the circuit macro 110, the isolation of the interface circuitry between the VDDM power domain and the VDD power domain in the circuit macro 110 can be enabled to reduce the leakage current due to the DC leakage path of the cross-domain circuit in the circuit macro 110.

Similar to the power detector 210 of FIG. 3 and FIG. 4, the power detector 210 in FIG. 5 is also configured to generate and output the power management signal PWR_RDY according to the power supply signal (e.g., power voltage VDDM) of the first power supply and the status signal (e.g., status signal SD). The power management signal PWR_RDY is also used to confirm whether the power voltages and the status signal SD are at their respective proper levels. Compared to the power management signal PWR_RDYB outputted by the power detector 210 of FIG. 3 and FIG. 4, the power management signal PWR_RDY outputted by the power detector 210 in FIG. 5 is a power ready signal. When the power management signal PWR_RDY is a logical high, the power voltages and the status signal SD are ready for performing the circuit operation. When the power management signal PWR_RDY is a logical low, the power voltages and the status signal SD are not ready for performing the circuit operation. Alternatively stated, the logical values of the power management signal PWR_RDY and the power management signal PWR_RDYB are opposite. In some embodiments, a NOT gate logic circuit can be used to receive the power management signal PWR_RDYB and output the corresponding power management signal PWR_RDY having the opposite logic value, but the present disclosure is not limited thereto. Various circuits can be applied to carry out the power management signal PWR_RDY based on the power supply signal (e.g., power voltage VDDM) of the first power supply and the status signal (e.g., status signal SD).

In embodiments of FIG. 5, the logic circuit 220 includes a NOT gate logic circuit 522 and a NAND gate logic circuit 524 coupled to the NOT gate logic circuit 522. The NOT gate logic circuit 522 is configured to receive the status signal (e.g., the status signal SD) and to output a control signal SD_B being opposite to the status signal.

A first input terminal of the NAND gate logic circuit 524 is coupled to the power detector 210 and configured to receive the power management signal PWR_RDY. A second input terminal of the NAND gate logic circuit 524 is coupled to an output terminal of the NOT gate logic circuit 522 and configured to receive the control signal SD_B. An output terminal of the NAND gate logic circuit 524 is configured to output the isolation signal ISO.

Accordingly, when the status signal SD is a logical high, the output signal of the NOT gate logic circuit 522 (e.g., the control signal SD_B) is a logical low, which causes the NAND gate logic circuit 524 to output the isolation signal ISO with a logical high value regardless the values of the power management signal PWR_RDY or the values of the power supply signals (e.g., power voltages VDDM, VDD).

When the status signal SD is a logical low, the output signal of the NOT gate logic circuit 522 (e.g., the control signal SD_B) is a logical high. The NAND gate logic circuit 524 outputs the isolation signal ISO in response to the logical value of the power management signal PWR_RDY.

If the power management signal PWR_RDY is a logical low, the NAND gate logic circuit 524 outputs the isolation signal ISO at a logical high, enabling the isolation of the interface circuitry and reduces the cross-domain leakage current. If the power management signal PWR_RDY is also a logical high, indicating the normal operation, the NAND gate logic circuit 524 outputs the isolation signal ISO at a logical low, and the isolation is not enabled.

Figure 6:
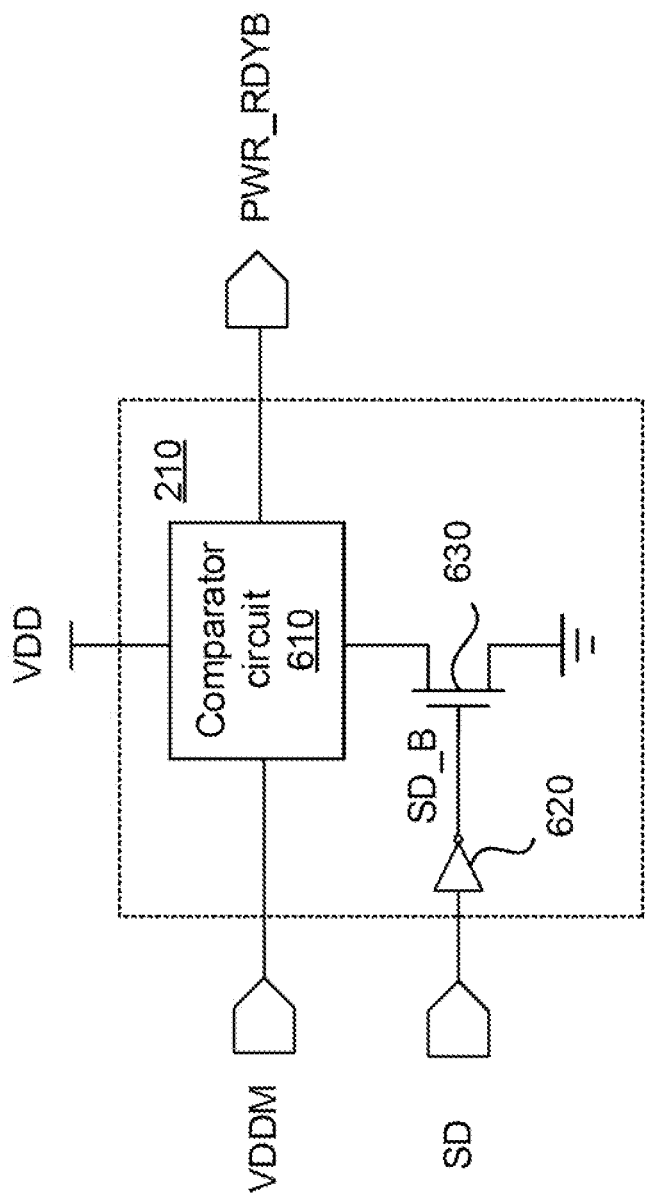
FIG. 6 is a diagram illustrating a first detailed design the power detector, according to some embodiments of the present disclosure.

FIG. 6 is a diagram illustrating a detailed design of the power detector 210 of FIG. 3, according to some embodiments of the present disclosure. In some embodiments, the power detector 210 can be implemented based on the design described herein. As shown in FIG. 6, in some embodiments, the power detector 210 includes a comparator circuit 610, an inverter circuit 620 and a NMOS transistor 630.

The comparator circuit 610 is configured to detect the first power supply signal (e.g., VDDM) and the second power supply signal (e.g., VDD) to output the power management signal PWR_RDYB. The inverter circuit 620 is configured to receive the status signal SD from the input terminal and output the opposite logical value of the status signal SD from the output terminal. The NMOS transistor 630 is coupled between the comparator circuit 610 and a power ground reference, and a control terminal (e.g., a gate terminal) of the NMOS transistor 630 is coupled to the output terminal of the inverter circuit 620. Accordingly, the NMOS transistor 630 is configured to selectively connect or disconnect the comparator circuit 610 to the power ground according to the status signal SD.

In other words, the power detector 210 is gated by the status signal SD. Accordingly, the leakage current due to the floating power supply signal (e.g., VDDM) during the sleep phase and the transient current occurred during the power-on or power-off phases can both be reduced.

Figure 7:
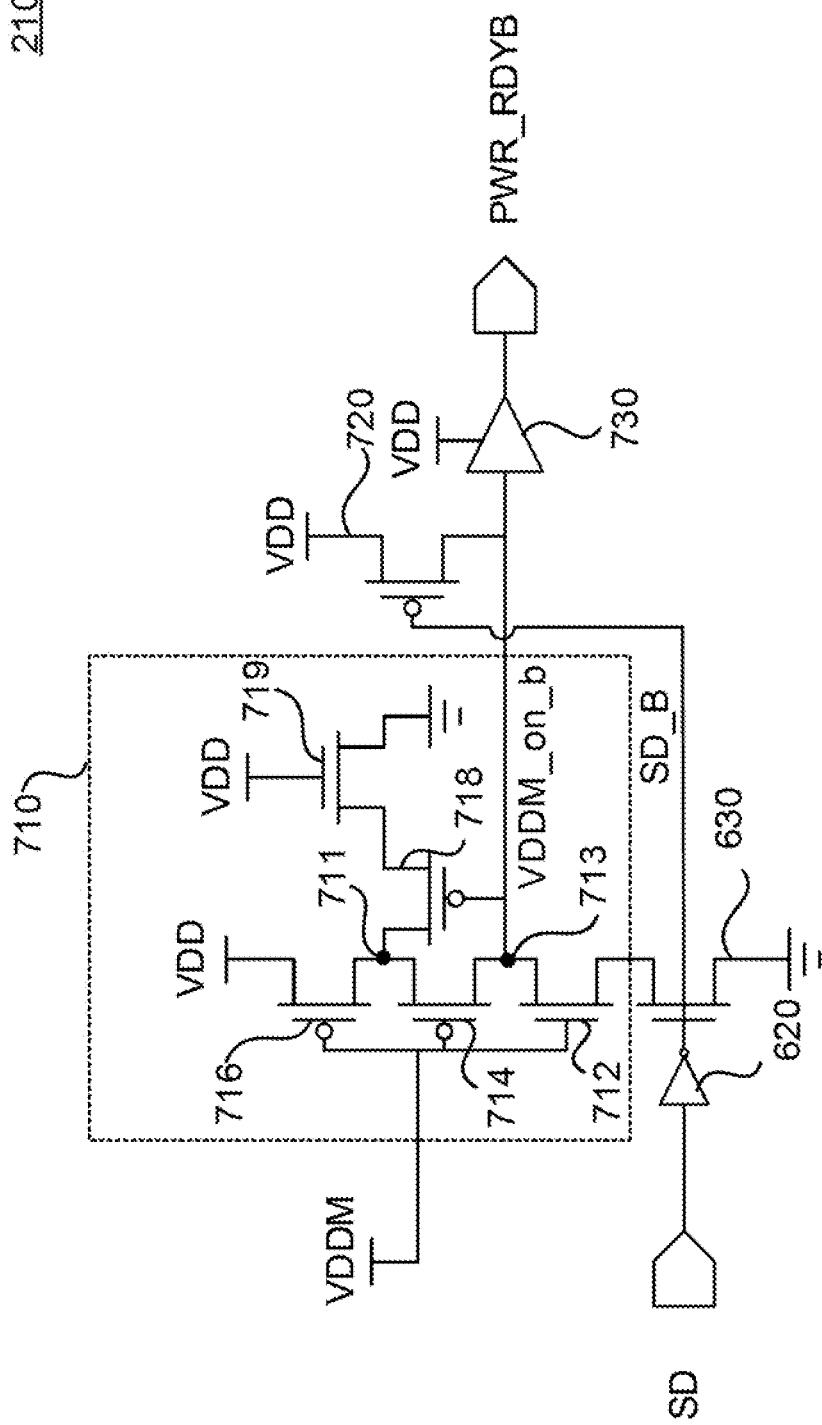
FIG. 7 is a diagram illustrating a second detailed design of the power detector, according to some embodiments of the present disclosure.

FIG. 7 is a diagram illustrating a second detailed design of the power detector 210 of FIG. 3, according to some embodiments of the present disclosure. In some embodiments, the power detector 210 can be implemented based on the design described herein. As shown in FIG. 7, in some embodiments, a comparator circuit 710 can be or include a Schmitt trigger circuit formed by transistors 712, 714, 716, 718, and 719. The Schmitt trigger circuit is an active circuit which converts an analog input signal—here the monitored power supply voltage VDDM—to a digital output signal. The circuit retains its value until the input changes sufficiently to trigger a change. In some embodiments, an inverting Schmitt trigger can be used, such that when the input is higher than a chosen threshold, the output is low. When the input is below a chosen threshold the output is high, and when the input is between the two levels the output retains its value.

In FIG. 7, the VDDM comparator circuit 710 is implemented as an inverting Schmitt trigger. The comparator circuit 710 includes a transistor stack coupled between VDD and the NMOS transistor 630. The transistor stack includes an NMOS transistor 712 and PMOS transistors 714 and 716. The gate terminals of transistors 712, 714 and 716 are coupled to the monitored power supply voltage, which is the power supply voltage VDDM in some embodiments. A PMOS transistor 718 is coupled to a node 711 between PMOS transistors 714, 716. The other source/drain terminal of the PMOS transistor 718 is coupled to a source/drain terminal of a NMOS transistor 719, which has a gate terminal tied high to the power supply voltage VDD. It should be understood that the power supply voltage "VDD" connected to the gate terminal of the NMOS transistor 719 and "VDD" tied to the source/drain terminal of the PMOS transistor 716 have the same logic high value dictated by the VDD domain but do not necessarily come from the same VDD branch and thus can ramp up/down together or independent of one another. The control signal VDDM_on_b is provided at node 713, which is between the NMOS transistor 712 and the PMOS transistor 714 and tied to the gate terminal of the PMOS transistor 718.

When the status signal SD is a logical low, according to operations of the inverter circuit 620 and the NMOS transistor 630, the other source/drain terminal of NMOS transistor 712 is coupled to the power ground via the NMOS transistor 630. Accordingly, by the circuit operations, the control signal VDDM_on_b is a logical high when the power supply voltage VDD is at its proper level while the power supply voltage VDDM is not on. Upon the power supply voltage VDDM reaching a rising threshold level, the control signal VDDM_on_b turns to a logical low accordingly. In addition, the Schmitt trigger circuit may provide a rising trigger point that is different than the falling trigger point, and specifically the rising trigger point is higher than the falling trigger point. That is, the rising trigger point may be set exclusively by the inverter stack that includes the NMOS transistor 712, the PMOS transistor 714 and the PMOS transistor 716. That trigger point is determined by, and can be customized by, the number of NMOS and PMOS transistors in the stack and their driving strengths. The other transistors, specifically the PMOS transistor 718 and the NMOS transistor 719, are used to weaken the drive of the PMOS transistors 714, 716, which lowers the falling trigger point, making it more difficult to switch the control signal VDDM_on_b from low to high. Particularly, when the power supply voltage VDDM falls to the threshold voltage, the PMOS transistor 716 turns on first, but the PMOS transistor 714 remains off because the PMOS transistor 718 and the NMOS transistor 719 are on, and the voltage of the node 711 is at the ground voltage. At that point, the PMOS transistor 716 and the PMOS transistor 718 form a potential divider circuit. Thus, the voltage of the node 711 (e.g., the source terminal of the PMOS transistor 714) rises with the decreasing power supply voltage VDDM (e.g., the gate terminal of the PMOS transistor 714) until the PMOS transistor 714 turns on when the falling trigger point is reached. When both the PMOS transistors 714 and 716 are on, the control signal VDDM_on_b is switched from low to high, and the PMOS transistor 718 becomes off. In some embodiments, PMOS transistor 718 is known as a feedback transistor. Because the impedances of the PMOS transistor 716 and the PMOS transistor 718 depend on their sizes, by selecting the size of the PMOS transistor 718 in the Schmitt trigger circuit, the falling trigger point can be properly controlled and lowered to a desired voltage level.

The comparator circuit 710 is effective at reducing leakage current at both VDDM ramp up and ramp down. Particularly, because the comparator circuit 710 is a Schmitt trigger circuit, the control signal VDDM_on_b (e.g., the output of the Schmitt trigger circuit) remains at the current state until the input rises beyond the rising trigger point or falls below the falling trigger point. Accordingly, when the power supply voltage VDDM contain ripples (e.g., power bouncing) during the ramp up or the ramp down periods during the normal operation, the comparator circuit 710 avoids the leakage current which may be caused by the disconnection of the power source VDD from the VDD domain in response to the accidental switching of the control signal VDDM_on_b.

A PMOS transistor 720 has a source/drain terminal tied high to the power supply voltage VDD and another source/drain terminal coupled to the node 713, and a gate terminal coupled to the gate terminal of NMOS transistor 630.

When the status signal SD is a logical high, according to operations of the inverter circuit 620 and the NMOS transistor 630, the NMOS transistor 630 turns off and the other source/drain terminal of the NMOS transistor 712 is disconnected from the power ground. In addition, the PMOS transistor 720 turns on and pulls up the control signal VDDM_on_b to a logical high. Accordingly, when the status signal SD is a logical high, the power management signal PWR_RDYB is also a logical high. In some embodiments, a buffer logic circuit 730 is coupled to the output terminal of the comparator circuit 710 (e.g., the node 713) and configured to output the power management signal PWR_RDYB.

By the above circuit operations, the power detector 210 of FIG. 7 can be configured to output the power management signal PWR_RDYB with a logical high value when the status signal SD is a logical high, or when the monitored power supply voltage VDDM is not on.

Figure 8:
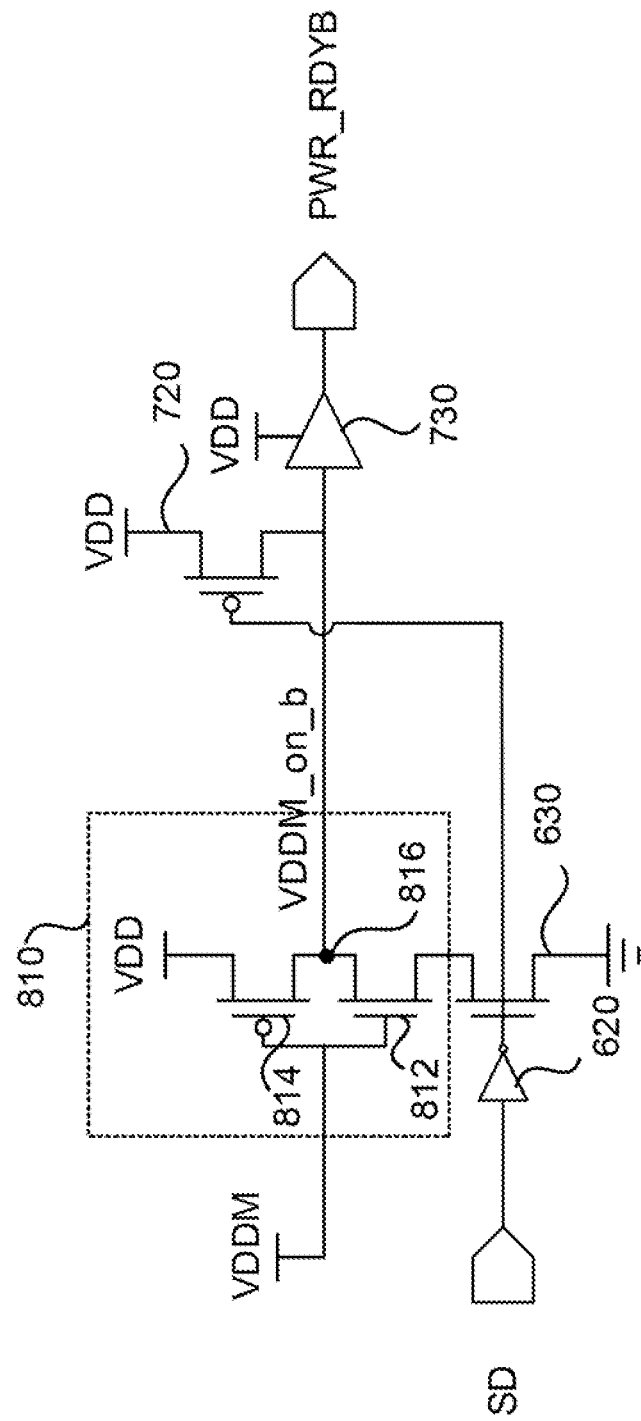
FIG. 8 is a diagram illustrating a third detailed design of the power detector, according to some embodiments of the present disclosure.

FIG. 8 is a diagram illustrating a third detailed design of the power detector 210 of FIG. 3, according to some embodiments of the present disclosure. In some embodiments, the power detector 210 can be implemented based on the design described herein. As shown in FIG. 8, in some embodiments, the power detector 210 can implement a comparator circuit by an inverter circuit 810, which also converts the analog input signal (e.g., the monitored power supply voltage VDDM) to the digital output signal. When the input is higher than the threshold value, the output is low. When the input is lower than the threshold value, the output is high.

The inverter circuit 810 includes a transistor stack coupled between VDD and the NMOS transistor 630. The transistor stack includes a first NMOS transistor 812 and a first PMOS transistor 814. The gate terminals of transistors 812 and 814 are coupled to the monitored power supply voltage, which is the power supply voltage VDDM in this embodiment. The control signal VDDM_on_b is provided at node 816, which is between NMOS transistor 812 and PMOS transistor 814.

When the status signal SD is a logical low, according to operations of the inverter circuit 620 and the NMOS transistor 630, the other source/drain terminal of the NMOS transistor 812 is coupled to the power ground via the NMOS transistor 630. Accordingly, by the circuit operations, the control signal VDDM_on_b is a logical high when the power supply voltage VDD is at its proper level while the power supply voltage VDDM is not on. Upon the power supply voltage VDDM reaching a rising threshold level, the control signal VDDM_on_b turns to a logical low accordingly.

When the status signal SD is a logical high, according to operations of the inverter circuit 620 and the NMOS transistor 630, the NMOS transistor 630 turns off and the other source/drain terminal of the NMOS transistor 812 is disconnected from the power ground. Similar to the embodiments of FIG. 7, the PMOS transistor 720 turns on and pulls up the control signal VDDM_on_b to a logical high. Accordingly, when the status signal SD is a logical high, the power management signal PWR_RDYB is also logical high. The components in FIG. 8 that are the same or similar to those depicted in FIG. 7 are given the same reference labels, and the detailed description thereof is omitted.

In some other embodiments, the power detector 210 can also be implemented by other comparator circuits, such as various inverter circuits, comparator circuits, or Schmitt trigger comparator circuits, etc. Circuits shown in FIGS. 7 and 8 are merely examples and not meant to limit the present disclosure.

Figure 9:
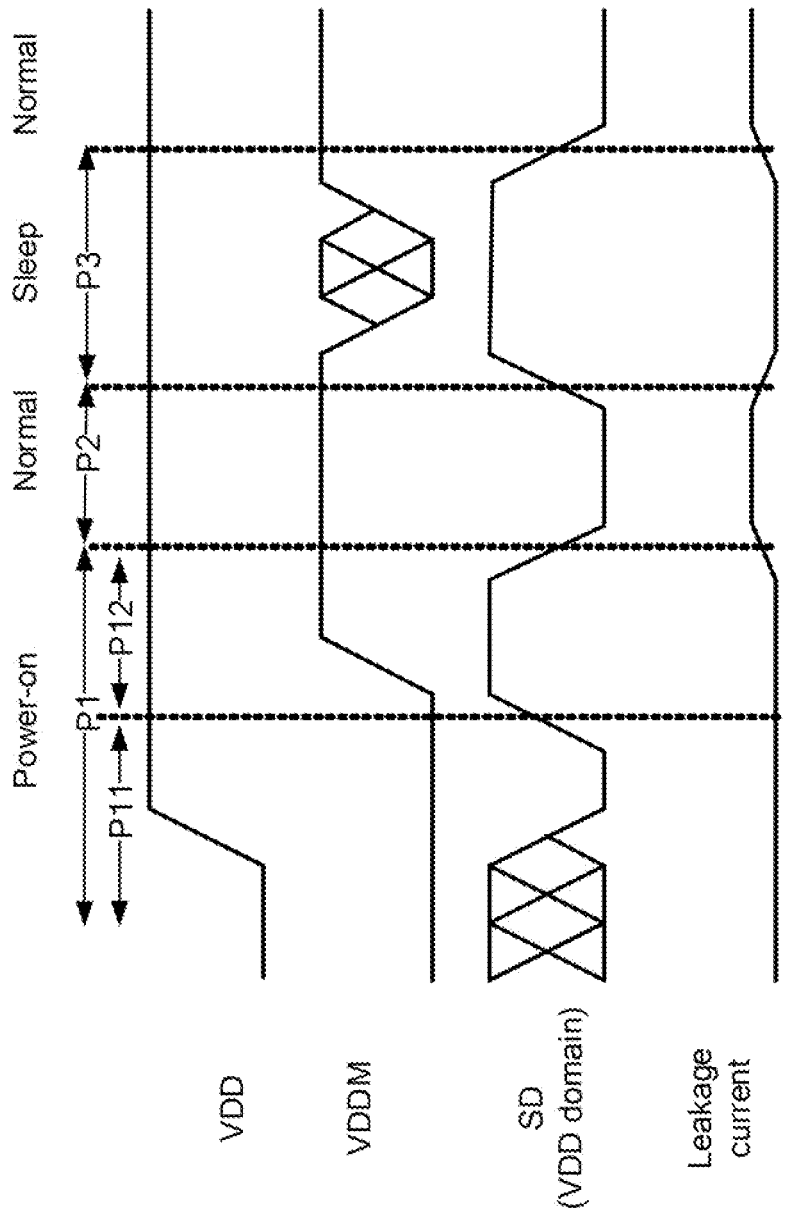
FIG. 9 is a timing diagram showing wave forms of the power voltages, the power management signal of the SOC system, and the leakage current of the circuit macro, according to some embodiments of the present disclosure.

FIG. 9 is a timing diagram 900 showing wave forms of the power voltages VDDM, VDD, the status signal SD in the SOC system 100 of FIG. 1, and the leakage current of the circuit macro 110, according to some embodiments of the present disclosure. Particularly, FIG. 9 illustrates the timing domain of the SOC system 100 with the power management circuit 200 of FIG. 4 or FIG. 5 including the power detector 210 shown in FIGS. 6-8.

The timing of the ramp-up and ramp-down of power voltages VDDM, VDD is now discussed. As shown in FIG. 9, it should be understood that power voltages VDDM, VDD may be powered on or off at different times and independent of one another. The circuit macro 110 is configured to operate in different modes (e.g., a normal mode, a shut-down mode, or a sleep mode) in response to the status signal SD, which is a "shut-down" status signal for indicating a sleep mode (or a power-saving mode) for the circuit. For example, when the circuit macro 110 is under the normal mode, the circuit macro 110 can be switched to the sleep mode in response to the logical high value of the status signal SD, and correspondingly turn off one or more power voltages VDDM, VDD to reduce the power consumption. Alternatively stated, one or more of the power supplies 130 and 140 of FIG. 1 for providing power voltages VDDM and VDD can be disabled under the sleep mode in response to the status signal SD. In some embodiments, in the sleep mode or power-saving mode, one of the power sources can be floating to reduce the leakage of the SOC system.

As shown in FIG. 9, during a power-on phase P1 of the SOC system 100, power voltages VDDM, VDD and the SOC status signal SD may not be turned on and the signals ramp up toward their respective targets or steady-state values at the same time due to circuit design limitation or design preference.

Within the power-on phase P1, during a period P11, when the power voltage VDD is already at its proper level, the SOC status signal SD is not on. However, the unsynchronized signals would not cause a large undesired interface leakage current between the VDDM domain circuit and the VDD domain circuit, because of the isolation between the VDDM domain circuit and the VDD domain circuit performed according to the logical low value of the power voltage VDDM (which results in a logical high value of the power management signal PWR_RDYB and a logical high value of the isolation signal ISO). During a period P12 following the period P11, the leakage current is also avoided due to the isolation performed according to a logical high value of the SOC status signal SD (which also results in a logical high value of the isolation signal ISO). Accordingly, as shown in FIG. 9, using the modified power management design with using the power detector 210 gated by the status signal SD, the undesired transient current that occurs during the power-on or power-off phases (e.g., phase P1) can be reduced or avoided.

Within the first normal phase P2, the power voltages VDD and VDDM are both at their respective proper levels. The SOC status signal SD is off. Accordingly, the isolation is not performed. Under normal operations, a stand-by leakage current exists but is not significant.

After the first normal phase P2, when the SOC status signal SD turns on to the logical high value, the SOC system 100 enters a sleep phase P3. During the sleep phase P3, one or more power voltages VDD and VDDM may also be powered down to reduce the leakage current. For example, the power voltage VDDM may be disabled and floating. If the isolation is not performed, the cross-domain circuit in the circuit macro 110 would have a DC leakage path, causing the undesired interface leakage current. As shown in FIG. 9, the isolation is performed according to a logical high value of the SOC status signal SD in the sleep phase P3. By the modified power management design using the power detector 210 gated by the status signal SD, the interface leakage current between the VDDM domain circuit and the VDD domain circuit due to the floating power supply voltage VDDM during the sleep phase P3 can be further reduced.

In some other embodiments, the power detector 210 can be modified by adopting different types of switches, such as PMOS transistor switches, to replace the NMOS transistor 630 to selectively connect or disconnect the comparator circuit to a corresponding power reference node.

Figure 10:
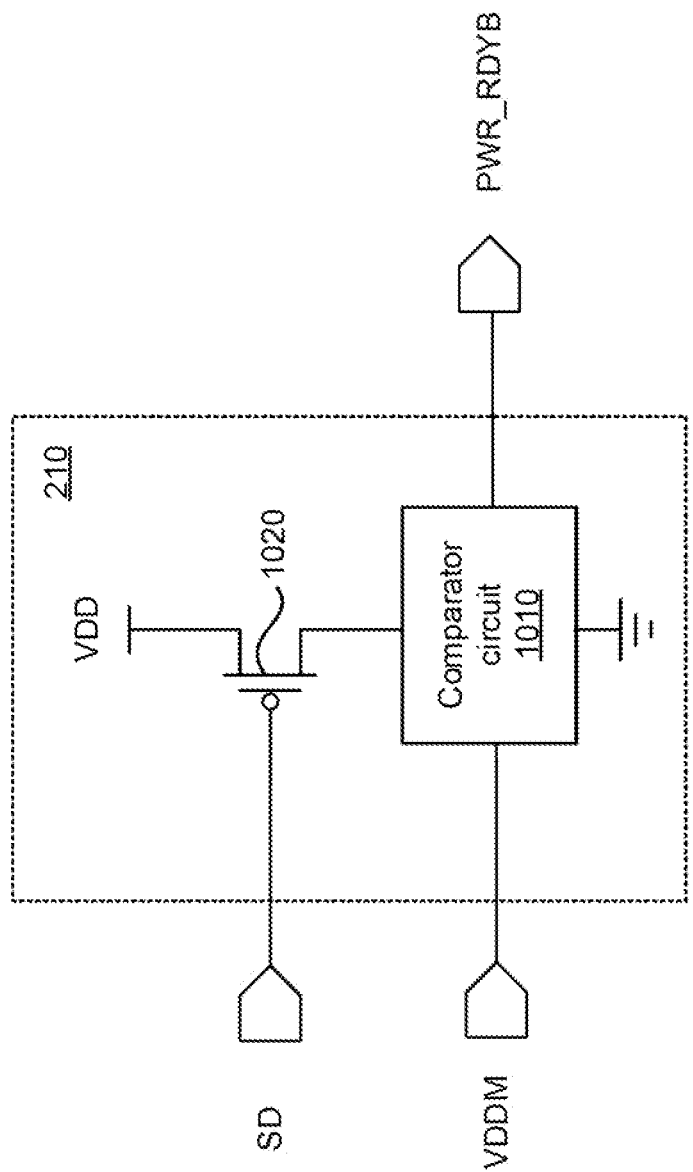
FIG. 10 is a diagram illustrating a fourth detailed design of the power detector, according to some embodiments of the present disclosure.

FIG. 10 is a diagram illustrating a fourth detailed design of the power detector 210, according to some embodiments of the present disclosure. In some embodiments, the power detector 210 can be implemented based on the design 210 described herein. As shown in FIG. 10, in some embodiments, the power detector 210 includes the comparator circuit 1010 and a PMOS transistor 1020.

Compared to the power detector 210 in FIG. 6, in the power detector 210 in FIG. 10, the PMOS transistor 1020 is coupled between the comparator circuit 1010 and the second power supply (e.g., VDD), and a control terminal (e.g., a gate terminal) of the PMOS transistor 1020 is coupled to a corresponding pin to receive the status signal SD. Accordingly, the PMOS transistor 1020 can be configured to selectively connect or disconnect the comparator circuit 1010 to the second power supply (e.g., VDD) according to the status signal SD. Similar to the power detector 210 of FIG. 6, the power detector 210 is also gated by the status signal SD. Accordingly, the leakage current due to the floating power supply signal (e.g., VDDM) during the sleep phase and the transient current occurred during the power-on or power-off phases can be reduced.

Figure 11:
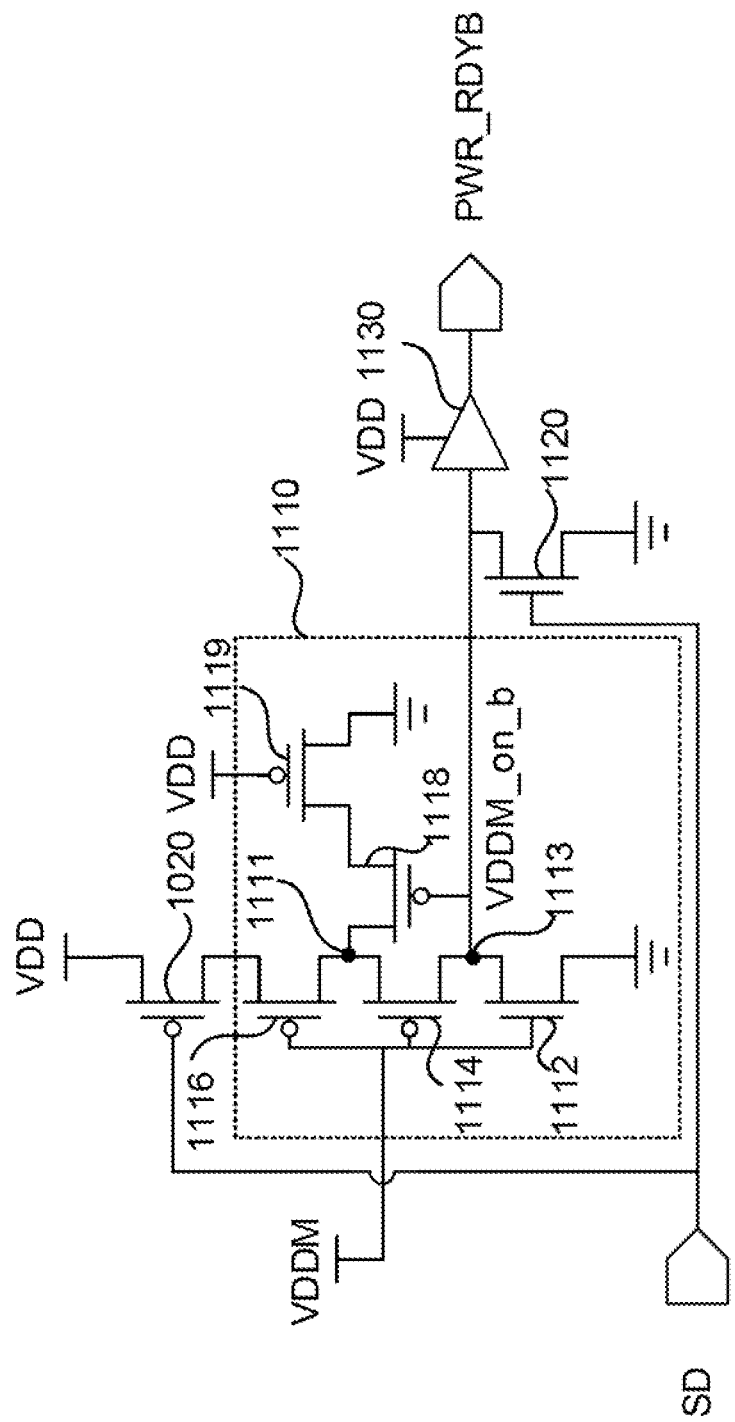
FIG. 11 is a diagram illustrating a fifth detailed design of the power detector, according to some embodiments of the present disclosure.

FIG. 11 is a diagram illustrating a fifth detailed design of the power detector 210, according to some embodiments of the present disclosure. In some embodiments, the power detector 210 can be implemented based on the design described herein. As shown in FIG. 11, in some embodiments, a VDDM comparator circuit 1110 can be or include a Schmitt trigger circuit formed by transistors 1112, 1114, 1116, 1118, and 1119. The comparator circuit 1110 includes a transistor stack coupled between the power ground and the PMOS transistor 1020. The transistor stack includes first NMOS transistor 1112 and first and second PMOS transistors 1114 and 1116. The gate terminals of transistors 1112, 1114 and 1116 are coupled to the monitored power supply voltage VDDM. A PMOS transistor 1118 is coupled to a node 1111 between PMOS transistors 1114, 1116. The other source/drain terminal of the PMOS transistor 1118 is coupled to a source/drain terminal of a PMOS transistor 1119, which has a gate terminal tied high to the power supply voltage VDD. The control signal VDDM_on_b is provided at node 1113, which is between NMOS transistor 1112 and PMOS transistor 1114 and tied to the gate terminal of the PMOS transistor 1118.

When the status signal SD is a logical low, according to operations of the PMOS transistor 1020, the other source/drain terminal of the PMOS transistor 1116 is coupled to the power supply voltage VDD via the PMOS transistor 1020. Accordingly, by the circuit operations, the control signal VDDM_on_b is a logical high when the power supply voltage VDD is at its proper level while the power supply voltage VDDM is not on. Upon the power supply voltage VDDM reaching a rising threshold level, the control signal VDDM_on_b turns to a logical low accordingly.

A NMOS transistor 1120 has a source/drain terminal coupled to the node 1113, another source/drain terminal coupled to the power ground, and a gate terminal coupled to the gate terminal of PMOS transistor 1020. Accordingly, the NMOS transistor 1120 can be configured to selectively connect or disconnect the output of the comparator circuit 1110 to the power ground according to the status signal SD.

When the status signal SD is a logical high, the PMOS transistor 1020 turns off and the other source/drain terminal of the PMOS transistor 1116 is disconnected from the power supply voltage VDD. In addition, the NMOS transistor 1120 turns on and pulls down the control signal VDDM_on_b to a logical low. In some embodiments, a buffer logic circuit 1130 is coupled to the output terminal of the comparator circuit 1110 (e.g., the node 1113) and configured to output the power management signal PWR_RDYB. By the above circuit operations, the power detector 210 can be configured to output the power management signal PWR_RDYB with a logical high value when the monitored power supply voltage VDDM is not on.

In some other embodiments, the power detector 210 can also be implemented by other comparator circuits. For example, the power detector 210 can be or include various inverter circuits, comparator circuits, or Schmitt trigger comparator circuits, etc. The circuit shown in FIG. 11 is merely an example and not meant to limit the present disclosure.

Figure 12:
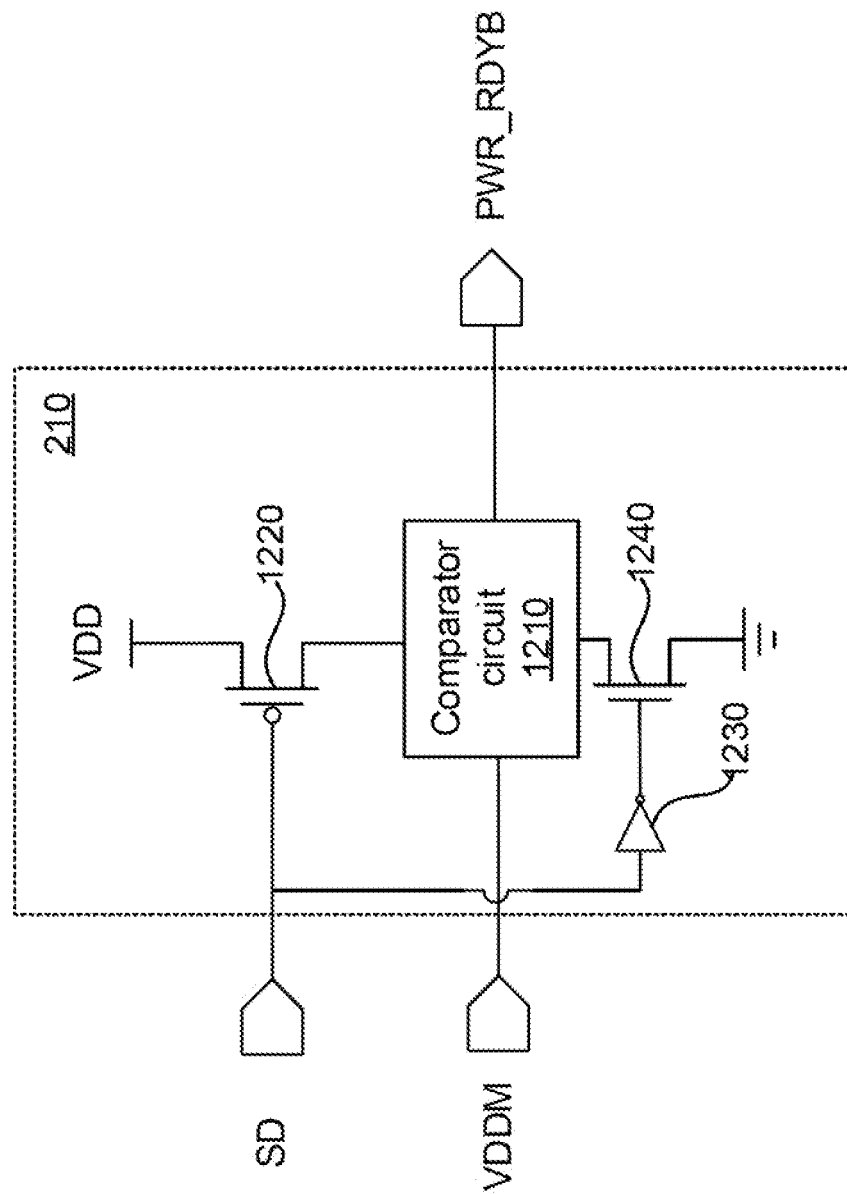
FIG. 12 is a diagram illustrating a sixth detailed design of the power detector, according to some embodiments of the present disclosure.

FIG. 12 is a diagram illustrating a sixth detailed design of the power detector 210, according to some embodiments of the present disclosure. As shown in FIG. 12, in some embodiments, the power detector 210 includes one comparator circuit 1210, a PMOS transistor 1220 coupled between the comparator circuit 1210 and the second power supply (e.g., VDD), an inverter circuit 1230 and a NMOS transistor 1240 coupled between the comparator circuit 1210 and the power ground reference. Similar to the embodiments above, the comparator circuit 1210 is configured to detect the first power supply signal (e.g., VDDM) and the second power supply signal (e.g., VDD) to output the power management signal PWR_RDYB. The inverter circuit 1230 is configured to receive the status signal SD from the input terminal and output the opposite logical value of the status signal SD from the output terminal.

A control terminal (e.g., a gate terminal) of the PMOS transistor 1220 is coupled to a corresponding pin to receive the status signal SD. A control terminal (e.g., a gate terminal) of the NMOS transistor 1240 is coupled to the output terminal of the inverter circuit 1230.

Accordingly, the PMOS transistor 1220 and the NMOS transistor 1240 are both configured to selectively connect or disconnect the comparator circuit 1010 to the second power supply (e.g., VDD) or the power ground according to the status signal SD. By gating the comparator circuit 1010 from both ends (e.g., the power source side and the ground side), the leakage current of the power detector 210 can be further reduced. Similar to the embodiments above, the comparator circuit 1210 can be achieved by different types of comparator circuits, such as various inverter circuits, comparator circuits, or Schmitt trigger comparator circuits, etc.

Figure 13:
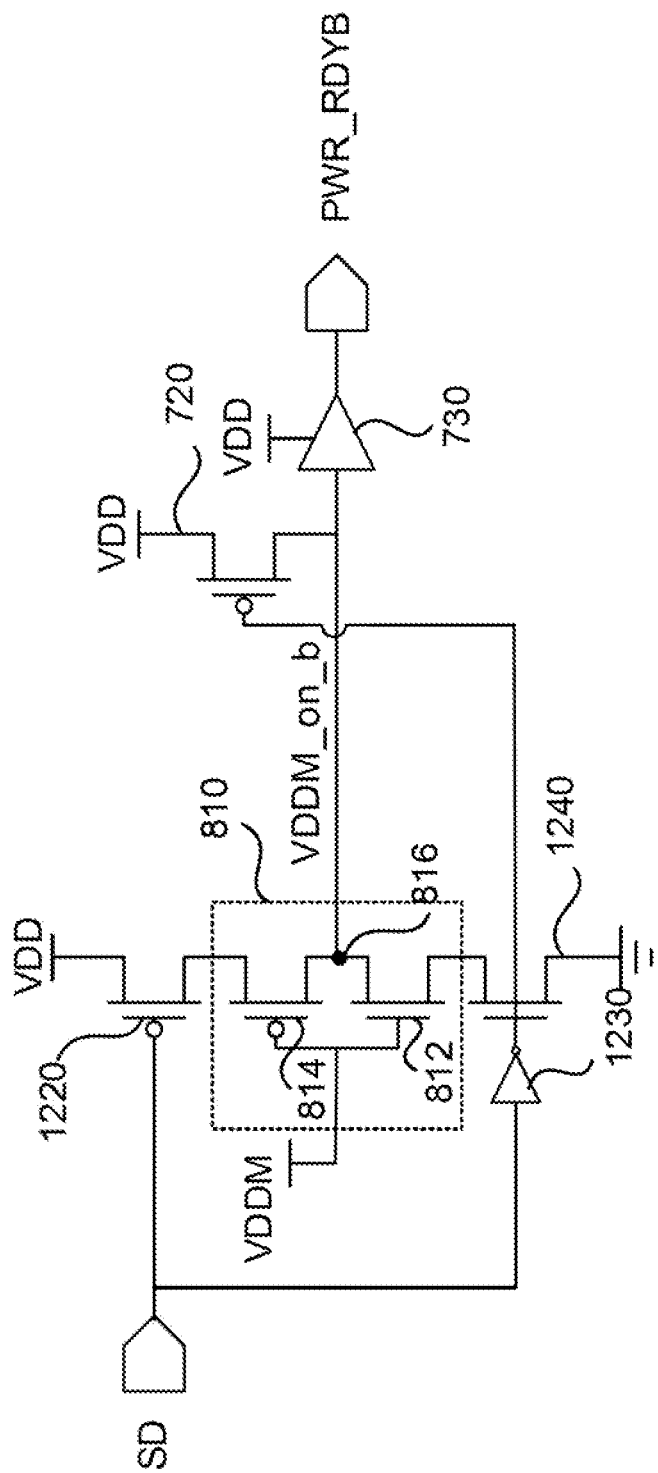
FIG. 13 is a diagram illustrating a seventh detailed design of the power detector, according to some embodiments of the present disclosure.

FIG. 13 is a diagram illustrating a seventh detailed design of the power detector 210, according to some embodiments of the present disclosure. As shown in FIG. 13, in some embodiments, the power detector 210 may implement the comparator circuit by the inverter circuit 810 in FIG. 8. Compared to the power detector 210 of FIG. 8, in the power detector 210 of FIG. 13, when the status signal SD is a logical low, the PMOS transistor 1220 and the NMOS transistor 1240 both turn on. Accordingly, the other source/drain terminal of the PMOS transistor 814 is coupled to the power supply voltage VDD via the PMOS transistor 1220, and the other source/drain terminal of the NMOS transistor 812 is coupled to the power ground via the NMOS transistor 1240.

When the status signal SD is a logical high, the PMOS transistor 1220 and the NMOS transistor 1240 both turn off, and the inverter circuit 810 is disconnected from both the power supply voltage VDD and the power ground, and the leakage current is further reduced.

Figure 14:
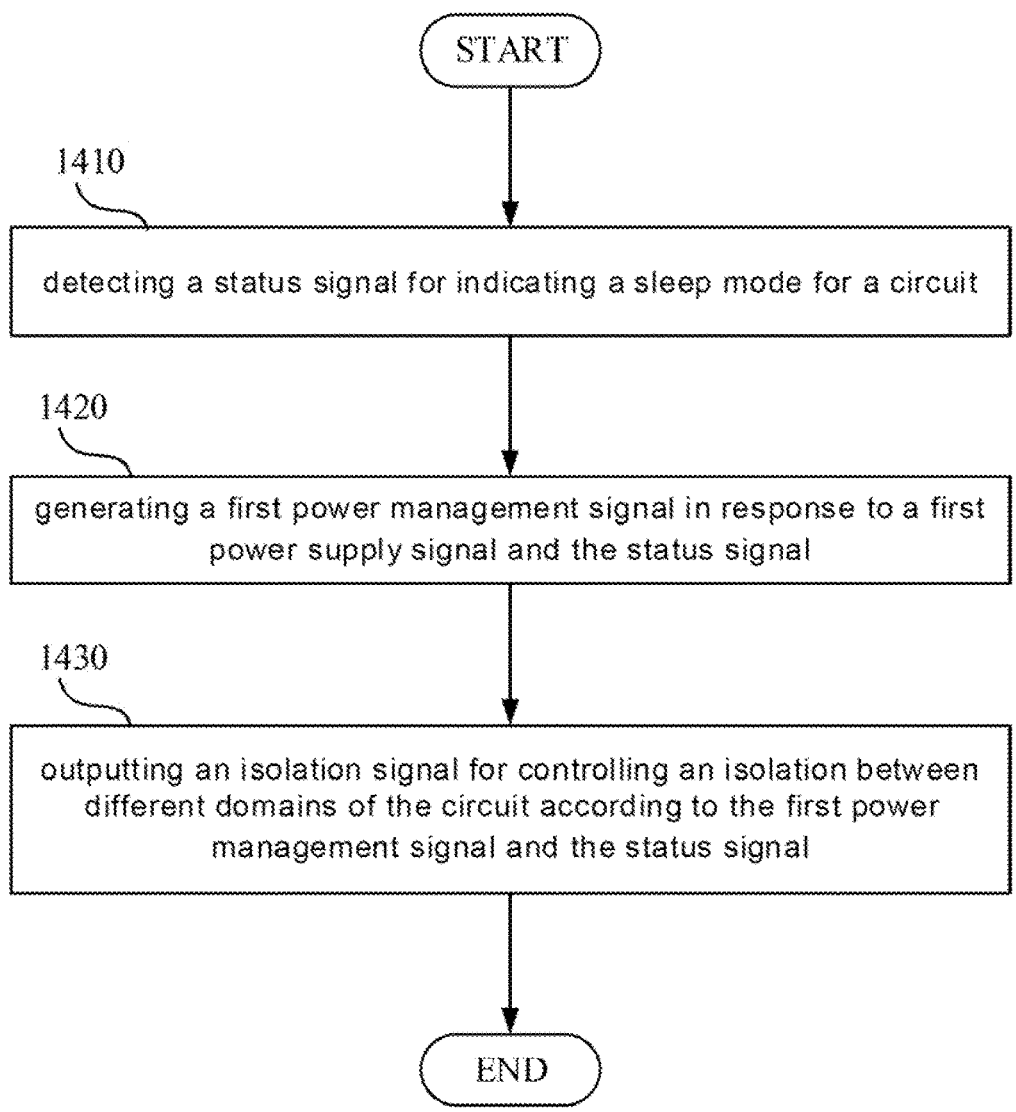
FIG. 14 is a flow diagram of an exemplary method of power management for a dual rail device, according to some embodiments of the present disclosure.

FIG. 14 is a flow diagram of an exemplary method 1400 of power management for a dual rail device, according to some embodiments of the present disclosure. In some embodiments, the method 1400 includes operations 1410, 1420, and 1430.

At operation 1410, a status signal for indicating a sleep mode for a circuit in the dual rail device is detected. In some embodiments, one of a first power supply or a second power supply in the dual rail device is disabled under the sleep mode.

At operation 1420, a first power management signal is generated in response to a first power supply signal associated with the first power supply and the status signal.

At operation 1430, an isolation signal for controlling an isolation between different domains of the circuit is provided as an output according to the first power management signal and the status signal. In some embodiments, in response to the status signal indicating the sleep mode, the isolation is enabled by the outputted isolation signal with a logical high. In some embodiments, in response to the first power management signal indicating a power-on status, the isolation is enabled by the outputted isolation signal with a logical high.

The various example embodiments herein are described in the general context of method steps or processes, which can be performed by hardware and/or software. For example, the method 1400 can be carried out by one or more circuits illustrated in FIGS. 3-8, and 10-13, but the present disclosure is not limited thereto. In some embodiments, methods disclosed herein may be implemented in one aspect by a computer program product, embodied in a transitory or a non-transitory computer-readable medium, including computer-executable instructions, such as program code, executed by computers in networked environments. A computer-readable medium may include removable and nonremovable storage devices including, but not limited to, Read Only Memory (ROM), Random Access Memory (RAM), compact discs (CDs), digital versatile discs (DVD), etc.

The above illustrations include exemplary operations, but the operations are not necessarily performed in the order shown. Operations may be added, replaced, changed order, and/or eliminated as appropriate, without departing from the spirit and scope of the present disclosure.

By arranging a power detector and utilizing one or more SOC power management signals in the power management circuit to output the isolation signal properly, the transient leakage current during the power-on or power-off stages and the standby leakage current of the power detector during the sleep mode can be reduced. In addition, the simple design of the power management circuit produces less area impact on a chip and is suitable for SOC applications.

In some embodiments, a circuit is disclosed that includes a power detector and a logic circuit. The power detector is configured to output a first power management signal according to a first power supply signal from a first power supply and a status signal. The circuit is configured to operate in different modes in response to the status signal. The logic circuit is configured to output a second power management signal, according to the first power management signal and the status signal.

In some embodiments, a system-on-chip device is also disclosed that includes a first power supply and a second power supply, a circuit, and a power management circuit. At least one of the first power supply and the second power supply is disabled under a sleep mode in response to a status signal. The circuit is configured to operate with the first power supply and the second power supply. The power management circuit is configured to transmit a first power management signal to control the circuit. The power management circuit includes a power detector configured to output the first power management signal according to the status signal and a first power supply signal associated with the first power supply.

In some embodiments, a method is also disclosed. The method includes: detecting a status signal for indicating a sleep mode for a circuit, the circuit including a first domain corresponding to a first power supply and a second domain corresponding to a second power supply, one of the first power supply or the second power supply being disabled under the sleep mode; generating a first power management signal in response to a first power supply signal associated with the first power supply and the status signal; and outputting an isolation signal for controlling an isolation between the first domain and the second domain of the circuit according to the first power management signal and the status signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power detector, comprising:
a comparator circuit configured to detect a first power supply signal, wherein the power detector is configured to output a first power management signal according to the first power supply signal from a first power supply and a status signal; and
at least two transistors coupled to the comparator circuit and configured to selectively connect or disconnect the comparator circuit to a second power supply or a power ground according to the status signal, the comparator circuit being connected to the second power supply or the power ground.

2. The power detector of claim 1, wherein the at least two transistors are configured to connect or disconnect the comparator circuit to the second power supply according to the status signal.

3. The power detector of claim 1, wherein the at least two transistors are configured to connect or disconnect the comparator circuit to the power ground according to the status signal.

4. The power detector of claim 1, further comprising:
a buffer logic circuit coupled to an output terminal of the comparator circuit and configured to output the first power management signal.

5. The power detector of claim 1, wherein the comparator circuit is coupled to a logic circuit, and the logic circuit is configured to output a second power management signal according to the first power management signal and the status signal.

6. The power detector of claim 5, wherein the logic circuit comprises an OR gate comprising a first input configured to receive the first power management signal and a second input configured to receive the status signal.

7. The power detector of claim 5, wherein the logic circuit comprises:
a NOT gate configured to receive the status signal and to output a control signal being opposite to the status signal; and
a NAND gate comprising a first input configured to receive the first power management signal and a second input configured to receive the control signal.

8. A system-on-chip device, comprising:
a first power supply and a second power supply, at least one of the first power supply and the second power supply being disabled under a sleep mode in response to a status signal; and
a power management circuit configured to transmit a first power management signal to control an operation of the first power supply and the second power supply, wherein the power management circuit comprises: a power detector configured to output the first power management signal according to the status signal and a first power supply signal associated with the first power supply, the power detector comprising a comparator circuit configured to detect the first power supply signal.

9. The system-on-chip device of claim 8, wherein the power management circuit further comprises:
a logic circuit configured to output a second power management signal according to the first power management signal and the status signal.

10. The system-on-chip device of claim 9, wherein the logic circuit comprises an OR gate, the OR gate comprising:
a first input terminal configured to receive the first power management signal;
a second input terminal configured to receive the status signal; and
an output terminal configured to output the second power management signal.

11. The system-on-chip device of claim 9, wherein the logic circuit comprises:
a NOT gate, comprising:
an input terminal configured to receive the status signal; and
an output terminal configured to output a control signal being opposite to the status signal; and
a NAND gate, comprising:
a first input terminal configured to receive the first power management signal;
a second input terminal connected to the output terminal of the NOT gate; and
an output terminal configured to output the second power management signal.

12. The system-on-chip device of claim 8, wherein the comparator circuit is coupled to the first power supply and the second power supply.

13. The system-on-chip device of claim 12, wherein the power management circuit further comprises a transistor configured to connect or disconnect the comparator circuit to the second power supply according to the status signal.

14. The system-on-chip device of claim 12, wherein the power management circuit further comprises a transistor configured to connect or disconnect the comparator circuit to a power ground according to the status signal.

15. The system-on-chip device of claim 12, wherein the power management circuit further comprises a transistor configured to connect or disconnect the second power supply to an output terminal of the comparator circuit according to the status signal.

16. The system-on-chip device of claim 12, wherein the power detector further comprises a buffer logic circuit coupled to an output terminal of the comparator circuit and configured to output the first power management signal.

17. The system-on-chip device of claim 8, further comprising:
a circuit configured to operate with the first power supply and the second power supply.

18. A method, comprising:
detecting, by a comparator circuit, a first power supply signal, associated with a first power supply;
generating a first power management signal in response to the first power supply signal and a status signal, the status signal indicating a sleep mode for a circuit, one of the first power supply or a second power supply being disabled under the sleep mode; and
outputting an isolation signal for controlling an isolation between a first domain and a second domain of the circuit according to the first power management signal and the status signal.

19. The method of claim 18, further comprising:
in response to the status signal indicating the sleep mode, enabling the isolation by the isolation signal.

20. The method of claim 18, further comprising:
in response to the first power management signal indicating a power-on status, enabling the isolation by the isolation signal.

* * * * *